United States Patent
Hsu et al.

(10) Patent No.: US 7,848,166 B2
(45) Date of Patent: Dec. 7, 2010

(54) CIRCUIT AND METHOD FOR A VDD LEVEL MEMORY SENSE AMPLIFIER

(75) Inventors: Kuoyuan Peter Hsu, San Jose, CA (US); Young Suk Kim, San Jose, CA (US); Bing Wang, Milpitas, CA (US); Ming Chieh Huang, San Jose, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 208 days.

(21) Appl. No.: 12/046,276

(22) Filed: Mar. 11, 2008

(65) Prior Publication Data

US 2009/0231939 A1 Sep. 17, 2009

(51) Int. Cl.
*G11C 7/08* (2006.01)
*G11C 7/12* (2006.01)

(52) U.S. Cl. .................. 365/203; 365/204; 365/205

(58) Field of Classification Search ............ 365/189.09, 365/20, 205, 207
See application file for complete search history.

(56) References Cited

U.S. PATENT DOCUMENTS

| | | | |
|---|---|---|---|
| 5,910,924 A * | 6/1999 | Tanaka et al. ............... | 365/226 |
| 6,351,426 B1 | 2/2002 | Ohsawa | |
| 6,532,167 B2 * | 3/2003 | Kaneko et al. ............... | 365/149 |
| 6,954,371 B2 | 10/2005 | Hokari et al. | |
| 2008/0159028 A1 * | 7/2008 | Choi ........................ | 365/201 |
| 2008/0181038 A1 * | 7/2008 | Clinton ..................... | 365/203 |

OTHER PUBLICATIONS

Tantawy, R., et al., "Performance Evaluation of CMOS Low Drop-Out Voltage Regulators," 47th IEEE International Midwest Symposium on Circuits and Systems, Jul. 25-28, 2004, pp. I-141-I-144, vol. 1.

Maity, A., et al., "On-chip Voltage Regulator with Improved Transient Response," IEEE Proceedings of the 18th International Conference on VLSI Design, Jan. 3-7, 2005, pp. 522-527.

* cited by examiner

*Primary Examiner*—Hoai V Ho
*Assistant Examiner*—James G. Norman
(74) *Attorney, Agent, or Firm*—Slater & Matsil, L.L.P.

(57) ABSTRACT

A circuit and method for a sense amplifier for sensing the charge stored by a memory cell is disclosed. The memory cell is coupled to a bit line, a complementary bit line and a differential sense amplifier is coupled to the bit line and the complementary bit line. A control signal couples a reference voltage to the complementary bit line. A positive precharge voltage is applied to the bit line and complementary bit line prior to the sense amplifier being enabled. The memory cell outputs a voltage to the bit line responsive to a word line, and the sense amplifier senses the differential voltage between the bit line and the complementary bit line responsive to a sense enable signal. A voltage regulator for generating the reference voltage, preferably about 80% of a positive supply voltage, is disclosed. A method of sensing data stored by a memory cell is disclosed.

29 Claims, 12 Drawing Sheets

CIRCUIT AND METHOD FOR A VDD LEVEL MEMORY SENSE AMPLIFIER

TECHNICAL FIELD

The present invention relates to a circuit and method for providing an improved sense amplifier and an associated voltage reference regulator circuit for use in dynamic memory circuits.

BACKGROUND

Highly integrated semiconductor circuits are increasingly important, particularly in producing battery-operated devices such as cell phones, portable computers (such as laptops), notebook computers and PDAs, wireless email terminals, MP3 audio and video players, portable wireless web browsers and the like, and these sophisticated integrated circuits increasingly include on-board data storage.

As is known in the art, such data storage may take the form of dynamic memory cells in which arrays of capacitive storage memory cells are provided, each memory cell having an access transistor. Data stored in such memory cells is actually a charge stored on a small capacitor, and the data is typically accessed by outputting the stored charge to a bit line coupled to a sense amplifier. The data is output when the access transistor is activated, typically by a word line coupled to the gate or control terminal of the transistor. Sense amplifiers are differential amplifiers. The input and output lines coupled from the memory cells to the memory array sense amplifier are typically referred to as bit lines or column lines. The sense amplifier operates by receiving a small differential voltage on one of the bit lines, while the other bit line remains at, or is coupled to, a reference voltage. To enable large arrays of memory cells to be used in implementing a memory device, pairs of global bit lines coupled to one or more differential sense amplifiers are often routed though the memory array, while pairs of local bit lines for transmitting and receiving read and write data to and from the sense amplifiers are formed in columns in sub-arrays. The local bit lines are usually arranged as columns coupled to rows of memory cells. The global bit lines may also be coupled to another differential sense amplifier, and finally to an input/output circuit that transfers the memory array data to and from other devices.

Dynamic memory cells may be used in stand alone or commodity memory devices such as DRAM integrated circuits (ICs). These ICs are usually supplied in the form of cards populated with several commodity DRAM ICs to make a complete array of memory, for example, so called SIMM or DIMM cards. These cards are then provided as a finished memory for a desktop or laptop computer. Increasingly, embedded dynamic memory is becoming important in the production of advanced integrated circuits. These embedded memory modules may be a portion of an integrated circuit that provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit. The embedded memory arrays used in such devices must be very space efficient, power efficient, reliable and compatible with semiconductor processes that form logic circuitry and other types of circuitry on-board the same integrated device. Typically, the embedded dynamic memory in such integrated circuits is referred to as e-DRAM.

FIG. 1 depicts a small portion of a typical dynamic memory circuit. Dynamic memory must be refreshed periodically because the stored charge in the cells leaks away over time. As is known in the art, timing circuitry (hardware or software) will track the time elapsed since the last access to the memory cells and will cause the circuit to "refresh" the cells when needed. Refresh is done simply by performing a read followed by a restore or "write back" cycle to the cells.

Any read of a memory cell such as the memory cell MC in FIG. 1 is destructive, so the cell is always restored or rewritten at the end of the cycle. A "write" is simply a read cycle with write data impressed on the respective local bit line during the "restore" portion of the cycle. For a write, the read data is replaced or overwritten with the write data and then written into the cell. Thousands or even millions of these memory cells are used to form a practical dynamic memory device.

In FIG. 1, memory cell MC is coupled at an intersection between a row or word line WL and a column or bit line BL. Although only one memory cell MC is depicted, another cell will be placed at the intersection of each of a plurality of word lines WL and the bit line BL. Similarly, a plurality of memory cells will also be placed at the intersections of each of a plurality of row lines WL (only one of which is depicted in FIG. 1) and the complementary bit line ZBL of FIG. 1. A portion of a memory circuit may have 8, 16, 32, 64, 128 or more columns, typically arranged in word widths, and many word lines or rows typically arranged across the bit lines. Conventionally, the word lines or rows are laid out orthogonally to the columns as depicted in the simplified schematic of FIG. 1, although other arrangements are also known. Sense amplifier SA is coupled to a pair of local bit lines BL. Each pair of local bit lines BL and ZBL in the array will be coupled to such a sense amplifier SA. The bit lines BL and ZBL are each further coupled to the global bit lines GBL and ZGBL through the use of column select control line SSL and column select coupling transistors T28 and T29. In this manner many, many columns of memory cells may be arranged in sub-arrays and selectively coupled to the global bit lines; for a particular memory cycle, one memory cell, such as memory cell MC, is coupled to each pair of the global bit lines. The global bit lines GBL and ZGBL are again coupled to another differential sense amplifier (not shown) and the amplified sensed data is then output to I/O lines. The I/O lines will be arranged in a group to form a word of data for each cycle, for example, the memory device may be an X8 device with eight I/O lines forming a word, and X16, X32, X64 and X128 wide devices are also known.

The timing of a memory cycle for the prior art is depicted in FIG. 2. Prior to the timing as shown in FIG. 2, the BLEQ signal of FIG. 1 is active and forces the local bit lines BL and ZBL to a common, equalized voltage or "pre-charged" potential Vref, "precharged" using transistors T10, T24, and T25. In DRAM devices known in the prior art the precharge voltage Vref is typically set at a voltage approximately one half of the positive supply voltage Vdd.

The memory access cycle begins when the active word line WL transitions to a row select state. Since the memory access transistor $T_c$ in this example circuit of FIG. 1 is an N-channel MOS transistor, the word line WL transitions to a high positive voltage to cause the transistor $T_c$ to couple the capacitor $C_c$ to the bit line BL. The word line WL is supplied by an address decode circuit (not depicted) that determines which row in the memory array is active based on an address previously supplied to the memory array. This address decode circuitry is well known in the prior art and is not further described here. A short time after the word line WL goes active by transitioning to a positive voltage level, the access transistor $T_c$ couples the capacitor $C_c$ of the example memory cell MC to the respective bit line BL, and the "charge sharing" portion of the cycle begins. If the stored data in memory cell MC is a logical "1" the storage capacitor $C_c$ will add voltage to the bit line equalization voltage, already on BL during the charge sharing operation. In response, a small voltage increase $\Delta$VBL will be seen on the bit line BL, as shown in FIG. 2. If the stored data is a logical "0" the storage capacitor $C_c$ may subtract voltage from the bit line, for example, by charging the capacitor $C_c$ in the memory cell from the bit line BL. These logical data assignments are arbitrary and may be reversed, as is well known in the art.

Shortly after the "charge sharing" has begun, the timing diagram of FIG. 2 further illustrates the sensing portion of the memory cycle. In this part of the memory cycle, the control line SN, which is coupled to the two "pull down" NMOS transistors labeled T33 and T34 in FIG. 1, transitions from an equalized voltage of Vdd/2 to a low voltage of approximately Vss. Now, one of the two NMOS transistors T33 and T34 has a different voltage at its gate input than the other one, and the NMOS transistor with the more positive gate voltage will conduct current, coupling the opposite bit line to a low voltage. In this manner the small differential input voltage from the selected memory cell MC is "sensed" by the sense amplifier SA. In FIG. 2, the unselected bit line ZBL begins falling at this part of the cycle. Because the voltage at the gate of transistor T33 is slightly higher than the initial voltage on bit line ZBL, transistor T33 turns on and begins conducting, and as the voltage on bit line ZBL falls, transistor T33 remains on and conducting. In contrast, transistor T34 has a voltage on its source terminal of bit line BL, plus a delta voltage which is higher than the gate voltage received from bit line ZBL at the beginning of the sense cycle, and thus remains turned off. As the voltage on bit line ZBL falls further in response to the operation of transistor T33, the transistor T34 remains in cut-off state and never conducts, thus the voltage on bit line BL remains at the slightly increased voltage, adding a $\Delta$VBL voltage over the initial voltage Vdd/2 that was present on the bit line BL at the beginning of the sense operation.

Next, as seen in FIG. 2, the prior art memory sensing operation transitions to the "restore" portion of the cycle. In the restore portion of the cycle, (which in prior art sense amplifiers often follows the sense portion by a time period typically of one or more logic gate delays), the control signal SP transitions from the initial, equalized value, to a high potential, for example, Vdd. At this point the P-channel MOS transistors T36 and T37 become important in the sense amplifier SA. In FIG. 1, it can be seen that the node coupled to control signal SP rises to a high voltage. Transistor T36 now has the low voltage on bit line ZBL at its gate, and because it is a PMOS transistor, it turns on and couples the bit line BL to a high voltage from control signal SP. This causes the bit line BL potential to increase from the voltage Vdd/2 (initial voltage on bit line BL) plus the sensed differential voltage $\Delta$VBL to a logical "1" high voltage, or approximately Vdd. The transistor T37 has the voltage on bit line BL on its gate terminal, and because the voltage is higher than at its source terminal, this transistor remains in cut-off. As the voltage on bit line BL increases, transistor T33 turns on further and couples the bit line ZBL to the low voltage on control line SN more completely, thus the two bit lines BL and ZBL are now at a logical "1" and a logical "0," that is at full logic voltage levels. At this point in the memory cycle, the word line WL is still active so that the high voltage on bit line BL is also coupled into the memory cell MC, that is, the access transistor $T_c$ of memory cell MC will couple this high voltage to the memory cell storage capacitor $C_c$ and thus restore the stored charge for future accesses to this memory cell MC.

Finally, the sense cycle is completed when local bit lines BL and ZBL are coupled to the global bit lines GBL and ZGBL in FIG. 1, by the operation of column select line CSL (see FIG. 2). This action causes the data represented by the voltage potentials on bit lines BL and ZBL to be coupled to the global bit lines, GBL and ZGBL, for use by circuits external to the memory (not shown in FIG. 1).

The sense amplifier, column select and precharge circuits described above present only one known approach to the precharge, sensing and charge sharing operations. Alternatives known in the prior art DRAM devices include using dummy cells to provide reference voltages for sensing. In the dummy cell approach, a voltage may be placed on the non-selected bit line during sensing by selecting a dummy memory cell that is coupled to the bit line, which then eliminates the need for the sensed memory cell to store both a "0" and a "1" charge. Instead, the dummy cell can be operated so that for one logical value, the memory has no voltage effect on the selected bit line, while the dummy cell provides a delta voltage on the non-selected bit line. The sense amplifier then senses the "negative" delta voltage on the bit line (relative to, for example, an increase on the non-selected bit line caused by the dummy cell). U.S. Pat. No. 6,954,371 to Hokari, et al., issued Oct. 11, 2005, describes sensing using dummy cells in various embodiments.

If dummy memory cells are used, extra silicon area is required for the dummy cell capacitors and select transistors, and for the dummy word lines used to select the dummy cells. These area requirements negatively affect the packing density (by increasing the silicon area used per memory storage bit) and are thus undesirable in applications where silicon area is a critical factor, such as in embedded DRAM applications.

Alternative prior art approaches use voltage regulation schemes to create the required voltages for the bit line precharge, sensing and cell plate voltages (positive or negative voltage coupled to one plate of the storage capacitors in the memory cells). U.S. Pat. No. 6,351,426 to Ohsawa, issued Feb. 26, 2002, describes a lowered voltage supply for generating the power supply to the row and column decoders, and for generating the voltage $V_{BL}$ for precharging and for the voltage $V_{PL}$ for the cell plate. Other voltage regulators are described in the prior art. A paper entitled "On-Chip Voltage Regulator with Improved Transient Response," IEEE Proceedings of the 18$^{th}$ International Conference on VLSI Design, Jan. 3-7, 2005, pp. 522-527, describes an on-chip voltage regulator with a dynamic leakage element at the driver stage of the regulator to improve the transient behavior of the voltage regulator when the load current varies. A paper entitled "Performance Evaluation of CMOS Low Drop-Out Voltage Regulators," 47$^{th}$ IEEE International Midwest Symposium on Circuits and Systems, Jul. 25-28, 2004, pp. I-141-I-144, Vol. 1, describes three low drop out (LDO) voltage regulators for load regulation and compares the performances of the different circuits.

It is increasingly desirable to embed memory arrays into integrated circuits that also include additional digital or analog circuitry. Lay out features of these embedded memory or e-DRAM arrays must be compatible with other digital circuitry and provide good packing density or memory cells/silicon area. The memory must be very reliable with no cell disturb problems. To reduce power consumption, the trend is to decrease the supply voltage Vdd levels. As is known in the art, the need for reliable operation of DRAM cells in advanced semiconductor processes may limit the minimum power supply Vdd that can be used. Cell disturb problems are also known in the prior art, as feature sizes are reduced in smaller and smaller technologies. The use of an "early write" cycle to increase the amount of time the data is available on the selected bit line during a write operation is desirable. However, it is also known that this approach can lead to cell disturb errors. In cell disturb errors, cells on non-selected bit lines can have their stored charge altered, creating an erroneous memory read operation in future cycles. Prior art circuits require extra write select lines to isolate the non-selected memory cells to avoid the cell disturb problems. These added control lines also increase the silicon area required.

Thus, there is a continuing need for a memory sense amplifier and reference voltage circuit that provides reliable high speed sensing operations, particularly for embedded DRAM arrays, without the need for added write select signals or dummy cells required by the prior art approaches and without the corresponding increases in silicon area.

SUMMARY OF THE INVENTION

These and other problems are generally solved or circumvented, and technical advantages are generally achieved, by embodiments of the present invention, which provide circuits and methods to improve the operation of sense amplifiers and the voltage references used with the sense amplifiers without requiring dummy cells or added write select signals to enable high speed sense amplifier operations.

In one preferred embodiment, a full Vdd sense amplifier is provided with a reference voltage coupled to the non-selected bit lines from an on-chip voltage regulator.

In another preferred embodiment, a sense amplifier is provided with a separate read and write path from the global bit lines to the local bit lines. The local bit lines are not directly coupled to the global bit lines, thereby avoiding the cell disturb problems of the prior art. Instead, the data voltages are used to control the coupling of appropriate high and low potentials to the bit lines.

In another preferred embodiment, an improved voltage regulator circuit for providing a reference voltage to the non-selected bit lines is provided. The improved voltage regulator circuit provides a voltage Vref that is less than Vdd by a predetermined margin. The regulator uses a three-stage circuit to improve performance. The first stage is a differential feedback amplifier, the second stage is a common source amplifier, and the third stage is an NMOS driver transistor coupled to a current source. The regulator circuit provides the current sinking capacity needed to rapidly pull down the non-selected bit lines to a voltage reference that is lower than the Vdd precharge voltage by a predetermined amount.

In a further preferred embodiment, the voltage regulator circuit provides a voltage reference Vref that is approximately 80% of the precharge voltage Vdd to the non-selected bit lines. In another preferred embodiment, the sense amplifier and bit line circuits use a full Vdd precharge, with a reference voltage Vref for sensing that is less than Vdd from the regulator circuit.

In a preferred method for sensing memory cell data, the selected bit line is precharged to Vdd in a memory array using a full Vdd sense amplifier while the non-selected bit line is lowered from Vdd to a reference voltage Vref that is less than Vdd. If the selected memory cell is storing a charge, indicating a logical "1" data is stored there, the bit line remains high during charge sharing, and is therefore at a potential above the non-selected bit line for sensing. If the memory cell is storing a "0," the memory cell capacitor is not charged and thus discharges the selected bit line during charge sharing to a voltage less than the reference voltage on the non-selected bit line, representing "0" data, and the selected bit line is therefore below the non-selected bit line potential for sensing.

In another preferred method, a precharge voltage of Vdd is coupled to the local bit line and complementary local bit line of a memory array. During a memory cycle a selected bit line is coupled to a memory cell. The complementary non-selected bit line is coupled to a reference voltage that is a predetermined voltage less than the precharge voltage of Vdd. The reference voltage is provided by a voltage regulator. The differential voltage on the local bit lines is sensed by a dynamic latching differential sense amplifier. A pair of global bit lines receives voltages during a read that are representative of the voltage output by the differential sense amplifier. During a write cycle, voltages that are representative of the voltages on the global bit lines are coupled to the local bit lines and are written to the selected memory cells. The local bit lines and global bit lines are never directly coupled.

In a preferred method, read data from a pair of complementary bit lines is coupled to a pair of global bit lines from a sense amplifier by use of read transistors having their control terminals coupled to the local bit lines and by placing a positive potential on one of the global bit lines responsive to the data on the local bit lines.

In another preferred method, write data from a pair of complementary global bit lines is coupled to a pair of local bit lines and to a sense amplifier by use of write transistors having their control terminals coupled to the global bit lines and by placing a ground potential on one of the local bit lines responsive to the data on the global bit lines.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

The drawings, schematics and diagrams are illustrative and not intended to be limiting but are examples of embodiments of the invention, are simplified for explanatory purposes, and are not drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 3:
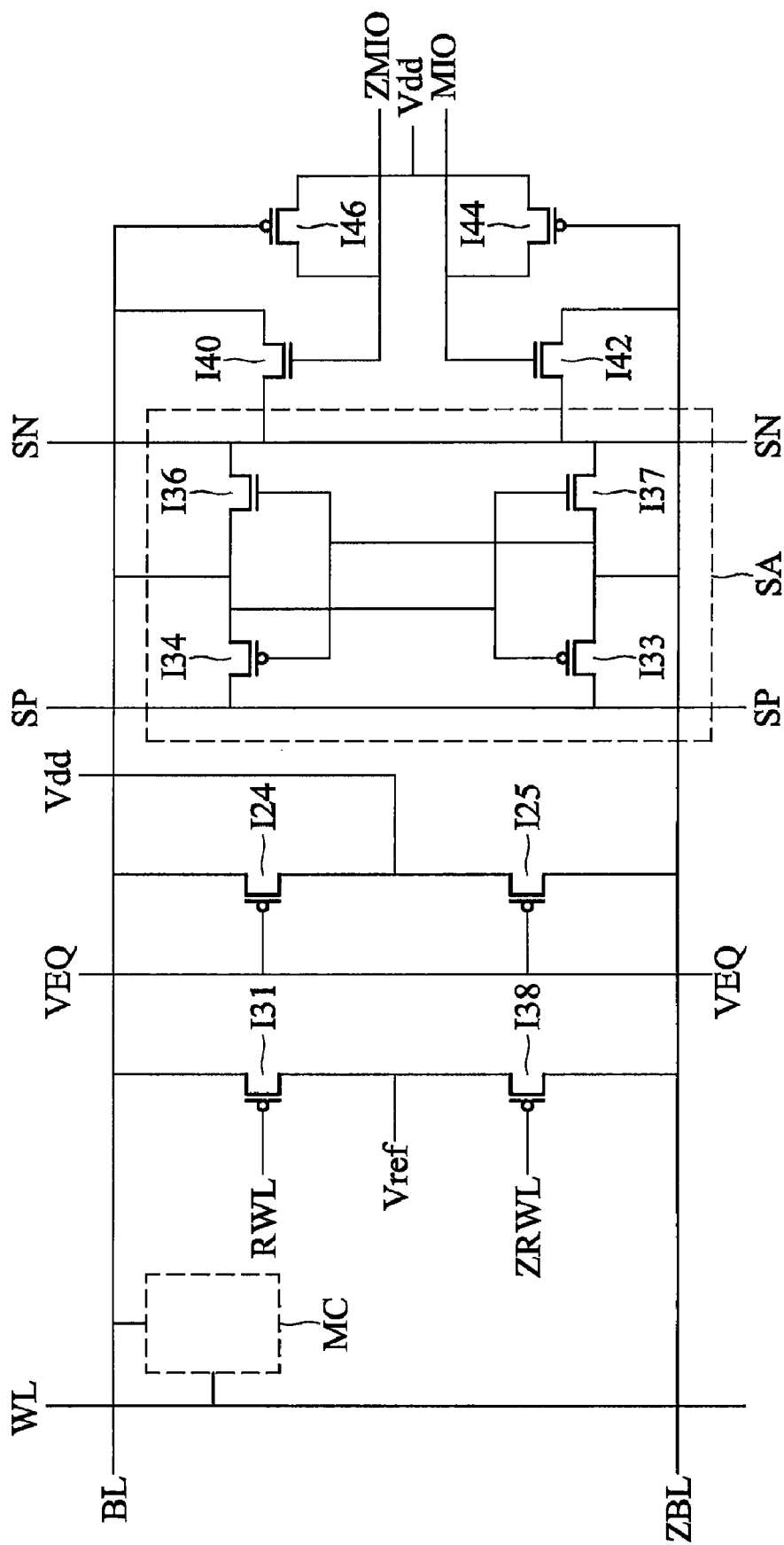
FIG. 3 illustrates a circuit diagram of a first preferred embodiment sense amplifier circuit and bit line arrangement of the present invention.

FIG. 3 depicts a full Vdd level sense amplifier SA and a global and local bit line arrangement implementing a first preferred circuit embodiment of the invention. In FIG. 3, an example memory cell MC is disposed at an intersection of a word or row line labeled WL and a local bit line BL. Although not shown, many other memory cells are similarly disposed in order to complete the memory array. Complementary bit line ZBL is also shown drawn parallel to bit line BL. Memory cell MC comprises an access transistor (not shown for clarity) having a control input coupled to the word line WL and a storage capacitor (not shown for clarity) which is coupled by the access transistor to the bit line BL in response to the word line WL. The storage capacitor within the memory cell MC will store a charge that represents either a logical zero or logical one value. In the exemplary embodiment of FIG. 3, the capacitor is charged to store a "1" and discharged to store a "0" value. This example is not limiting, and the logical value associated with the charge stored by a capacitor may be a "0" value instead.

An equalization circuit composed of P type MOS transistors I24, I25 is shown (in FIG. 3) coupling voltage Vdd to the bit lines BL and ZBL in response to input VEQ, which is an "active low" signal. Sense amplifier SA is a dynamic latching sense amplifier that senses a small, differential voltage ΔVBL (not shown) between the bit lines BL and ZBL following a charge sharing operation of the selected memory cell MC and one of the bit lines. Charge sharing occurs following a transition on an active word line WL at the beginning of a memory cycle.

N-channel transistors I40 and I42 and P-channel transistors I46 and I44 form two independent global bit line coupling paths, separated for write (N-channel MOS transistors I40 and I42) and read (P-channel MOS transistors I46 and I44). The global bit lines ZMIO and MIO are coupled during read cycles to the voltage Vdd, in response to the read data on the local bit lines BL and ZBL, by the P-channel transistors I46 and I44. Because the P-channel transistors I44 and I46 invert the data, that is a low voltage on local bit line BL during a read cycle will cause transistor I46 to couple global bit line ZMIO to Vdd, the global lines ZMIO and MIO are reversed with respect to the local bit lines BL and ZBL. In this manner the data inversion that takes place between the local bit lines BL and ZBL, and the global bit lines ZMIO and MIO, is accounted.

Figure 1:
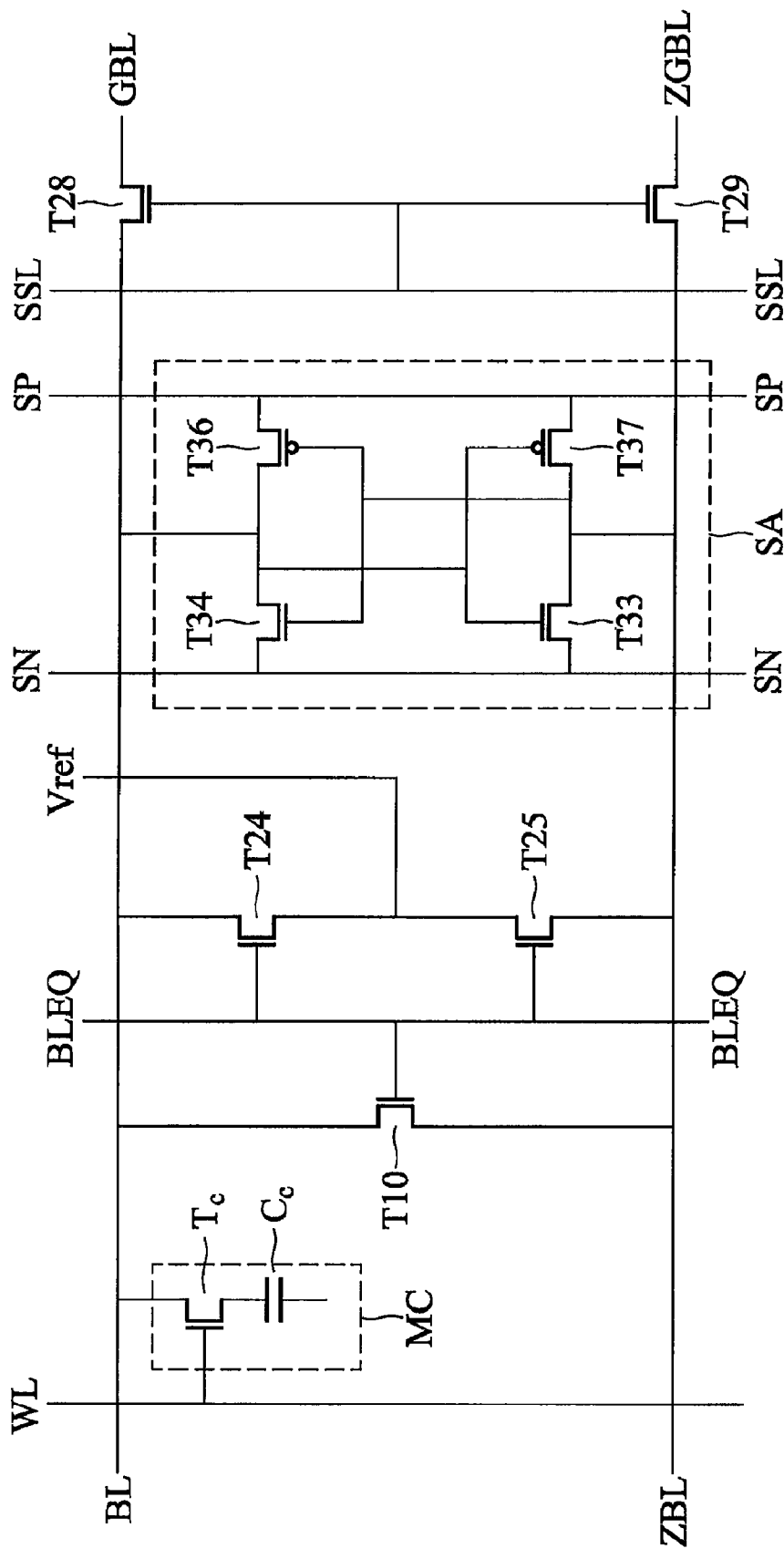
FIG. 1 illustrates a simplified circuit diagram for a portion of a prior art memory circuit including a sense amplifier.
Figure 2:
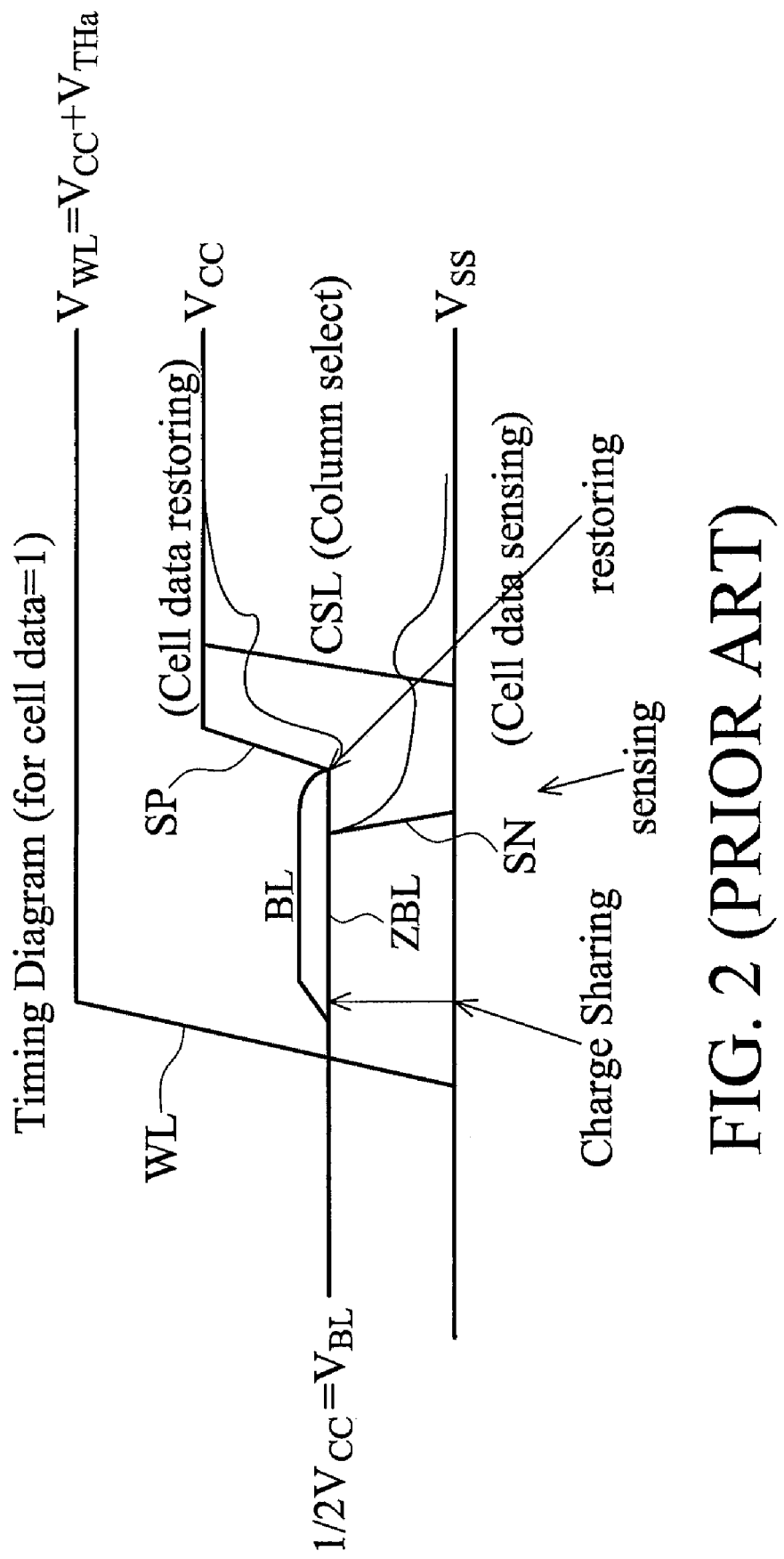
FIG. 2 illustrates a prior art timing diagram for the operation of the circuit of FIG. 1.

Transistors I40 and I42 in FIG. 3, similarly form the write path from the global bit lines MIO, ZMIO to the local bit lines BL, ZBL. The write data on the global bit lines MIO and ZMIO is not directly coupled to the local bit lines BL and ZBL. Instead, during a write cycle, the data present on the global bit lines MIO and ZMIO will couple one of the local bit lines BL, ZBL to the voltage at control line SN. The voltage at control line SN is "low" during certain sense and restore portions of the memory cycle as will be further described below. In contrast to the prior art sense amplifier SA of FIG. 1, the control lines SP and SN are maintained at half Vdd level, the same as the local bit lines BL and ZBL when the sense amplifier is not enabled. When the sense amplifier is enabled, it will pull SP to full "1" and SN to full "0" in the preferred embodiment sense amplifier of FIG. 3.

Transistors I31 and I38 of FIG. 3 are P-channel transistors (P-channel transistors are preferred since they are used to pass a voltage value that is close to Vdd) that couple a voltage reference Vref to the non-selected local bit line during operations. Control lines RWL and ZRWL determine which transistors I31 and I38 are active in a particular memory cycle. As described further below, the preferred embodiments of the invention provide a regulated reference voltage Vref that is used in conjunction with the full Vdd sense amplifier SA of FIG. 3 to provide the differential reference voltage used during the sensing operation. Transistors I31 and I38 determine when this reference voltage, which is lower than the Vdd voltage by a predetermined margin, is coupled to an non-selected bit line, for example, during read operations as further described below. Vref may be, typically, around 80% of Vdd and in alternative preferred embodiments, as low as 75% Vdd and as high as 85% Vdd.

The sense amplifier SA and bit line arrangement of FIG. 3 has several important aspects. As shown, the global bit lines ZMIO and MIO are not directly coupled to the local bit lines BL and ZBL. Instead, the transistors I40, I42, I44, I46 couple voltages to the local bit lines BL and ZBL in response to the read operation. Data on the global bit lines doing writes determine the voltage placed on the local bit lines BL and ZBL. The sensing scheme uses a full Vdd level precharge, and the reference voltage Vref is below the precharge, so that for a "1" logical value, no voltage change is required on the selected bit line.

Figure 4:
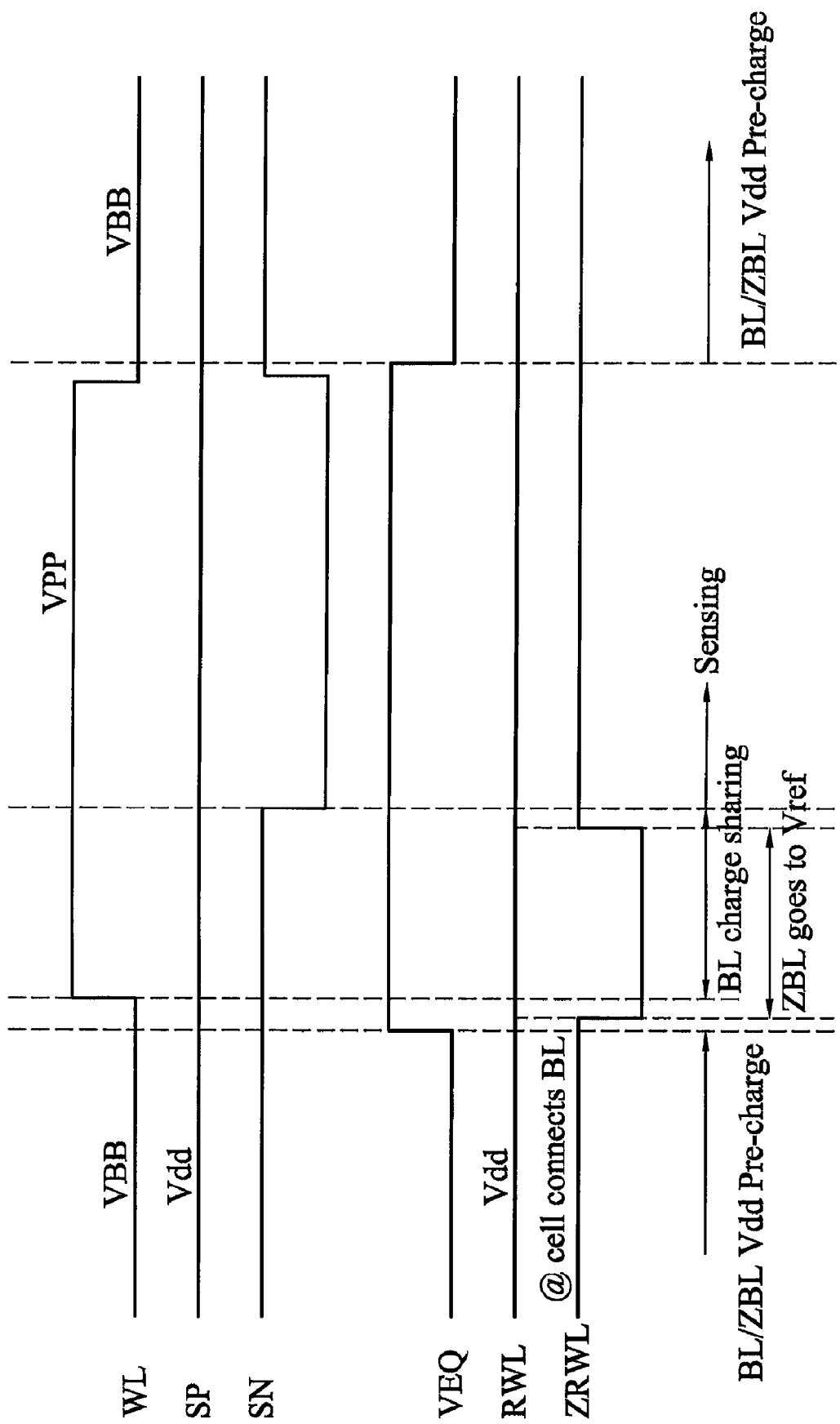
FIG. 4 illustrates a timing diagram for the operation of the control lines of the embodiment of FIG. 3.

FIG. 4 is a timing diagram that illustrates the operation of the control signals used in conjunction with the preferred embodiment sense amplifier circuitry of FIG. 3. In FIG. 4, prior to the memory cycle starting, the VEQ equalization line is low. This causes the P-channel equalization transistors to couple the precharge voltage Vdd to both of the local bit lines BL, ZBL. Just prior to the word line transition, and just following the equalization precharge, the non-selected bit line (here ZBL) is then coupled to the reference voltage Vref. This is performed by transistor I38 in response to the control line ZRWL going to an active low state.

The memory cycle begins when the word line WL transitions to a high voltage, which begins the charge sharing on the bit line BL. The memory cell will be coupled to the bit line BL by the word line WL and depending on the charge status of the storage capacitor, the bit line voltage (which was precharged to Vdd) may stay at that high level (if the storage capacitor in the memory cell is fully charged, representing a stored "1"). If the storage capacitor is in the discharged status, representing a logical "0" stored in the memory cell, the bit line BL will fall to a lowered voltage during the charge sharing part of the cycle. The lowered voltage on the bit line is arranged to be less than the reference voltage Vref on the non-selected complementary bit line ZBL to enable the sense amplifier SA to distinguish between sensing a stored "1," where the selected bit line is greater than Vref during the charge storing cycle, and sensing a stored "0," where the selected bit line has a voltage below the reference voltage Vref during sensing.

Following the charge sharing operation of the sense amplifier, the timing diagram of FIG. 4 illustrates the sensing operation. During the operation the SN control line transitions to a low voltage which provides a low voltage for the N transistors or "pull down" transistors in the sense amplifier SA. These transistors complete the sense and restore operations, and the dynamic latching operation of the sense amplifier SA will cause the more positive local bit line, BL or ZBL, during the sense cycle to transition to a full Vdd level, and the more negative local bit line, ZBL or BL, to transition to a full low level. For a "read" cycle, the data is restored to the memory cell MC when the word line WL falls back to an inactive low level. The voltage at controlling SN transitions to a high voltage which ends the sensing and restoring operations (i.e. sense amplifier SA is disabled). The VEQ precharge and equalization control line then falls to a low voltage level which readies the bit lines for the next memory cycle by again equalizing the local bit lines BL and ZBL.

The operation of the write from the global bit lines to the local bit lines, and the read from the local bit lines to the global bit lines, requires additional explanation. The global bit lines MIO and ZMIO begin a cycle at a low voltage level. These lines are then further coupled to another sense amplifier (not shown) which can sense a small potential difference and amplify that difference voltage to full logic levels for output (for a read) to I/O circuitry.

In a read cycle the P-channel transistors I44 and I46 determine which of the global bit lines ZMIO, MIO is coupled to the positive voltage Vdd based on the voltage on the local bit lines BL and ZBL after the sensing operation. Thus, if a "0" is read from the memory cell MC selected by the word line WL, during the charge sharing cycle, the bit line BL will fall below the Vref voltage on ZBL, the node SN will fall causing the sense cycle and restore cycle to start in sense amplifier SA. The N-channel pull down transistors I36 and I37 will latch the small difference voltage, the bit line BL will fall to a low voltage level, and the non-selected bit line ZBL will rise to a full Vdd level. The read transistor I44 will then have a high voltage on its gate input and will not be active, thus global bit line MIO will remain low. The read transistor I46 will be active because the voltage on bit line BL, a low voltage, is coupled to its gate terminal, thus a Vdd voltage will be coupled to the global bit line ZMIO. The read operation thus inverts the data in a sense cycle, and to account for this effect the P-channel read transistor controlled by the local bit line BL is coupled to the complementary global bit line ZMIO, and the P-channel read transistor controlled by the local bit line ZBL is coupled to the global bit line MIO.

If instead the data read from the memory cell is a stored "1," the storage capacitor will be charged when it is coupled to the local bit line BL. During the charge sharing operation, the bit line BL will remain high, while the complementary non-selected bit line ZBL is placed at the voltage level Vref. Voltage Vref is lower than the high level now on local bit line BL. When the voltage at control line SN falls enabling the sense amplifier to sense and restore the small differential voltage in this example, the sense amplifier will separate the bit lines BL and ZBL by latching the sensed voltage, causing a low voltage on bit line ZBL and a high voltage on bit line BL. In this example, the read transistor I44 will have a low voltage on its gate input, thus the positive voltage VDD will be coupled onto the global bit line MIO. In contrast, the read transistor I46 will have a positive voltage on its gate input, coupled to local bit line BL, and the global bit line ZMIO will remain at the low voltage. Thus, the stored "1" in the selected memory cell MC is represented by a "1" on global bit line MIO, a small positive voltage higher than the complementary global bit line ZMIO, which is available for sensing by the I/O differential sense amplifier in the I/O circuitry.

Write operations from the global bit lines ZMIO, MIO are also performed by the bit line and sense amplifier circuitry of FIG. 3. The write path is through the N-channel transistors I40, I42, and the voltage levels on global bit lines ZMIO, MIO are used to control whether the voltage on control line SN is coupled to the local bit lines BL, ZBL. In this manner the data from the global bit lines is not directly coupled to the local bit lines, but the data determines the voltage on the local bit lines during the "restore" part of the memory cycle. Thus, the read data sensed in the early part of the memory cycle will be replaced by the write data determined by the global bit lines. Again an inversion occurs from the global bit lines to the local bit lines and this is accounted for by coupling the write data from ZMIO, for example, to the local bit line BL, and the write data from MIO to the local bit line ZBL.

To explain a particular example, if the memory cell MC in FIG. 3 is selected, when the word line WL transitions to the high voltage VPP as shown in FIG. 4, the charge sharing cycle will begin again. When the voltage at control line SN falls to a low level beginning the sense and restore portion of the memory cycle, the write data can be input into the circuit. Assuming a "1" is to be written, a high voltage will be present on global bit line MIO. N-channel transistor I42 will couple the low voltage on control line SN to the non-selected local bit line ZBL. The sense amplifier SA will then latch the differential voltage and separate the bit lines so that a high voltage, representing a "1," is on the local bit line BL, and this high voltage will be coupled into the storage capacitor within the memory cell MC.

In the example of writing a "0" to the memory cell MC, the global bit line MIO will be left at a low voltage while the complementary global bit line ZMIO will be at a high voltage during the sense and restore operations. The high voltage on the gate of N-channel transistor I40 will couple the low voltage on control line SN to the local bit line BL, and the operation of the sense amplifier SA will then spread the local bit lines by raising the voltage on the non-selected bit line ZBL. The memory cell MC will then discharge the storage capacitor coupled to the low voltage on bit line BL and thus store the "0" value to complete the write cycle.

The sense amplifier and bit line arrangement of FIG. 3 supports an "early write" cycle without the need for additional local write select lines to isolate the write data on the global bit lines from non-selected cells.

The preferred embodiments of the present invention use a separate write path and read path for column select logic so that the non-selected local bit lines, and therefore the non-selected memory cells, are not disturbed. This is accomplished without requiring additional write select control lines or transistors.

The preferred embodiments of the invention also do not require dummy cells to provide the required reference potentials on the non-selected lines, so that additional silicon area for the dummy cells is not used. As described further below, the voltage Vref is provided by a voltage regulator specifically chosen for optimal operation in conjunction with the sense amplifier and bit line circuitry of FIG. 3.

Figure 5:
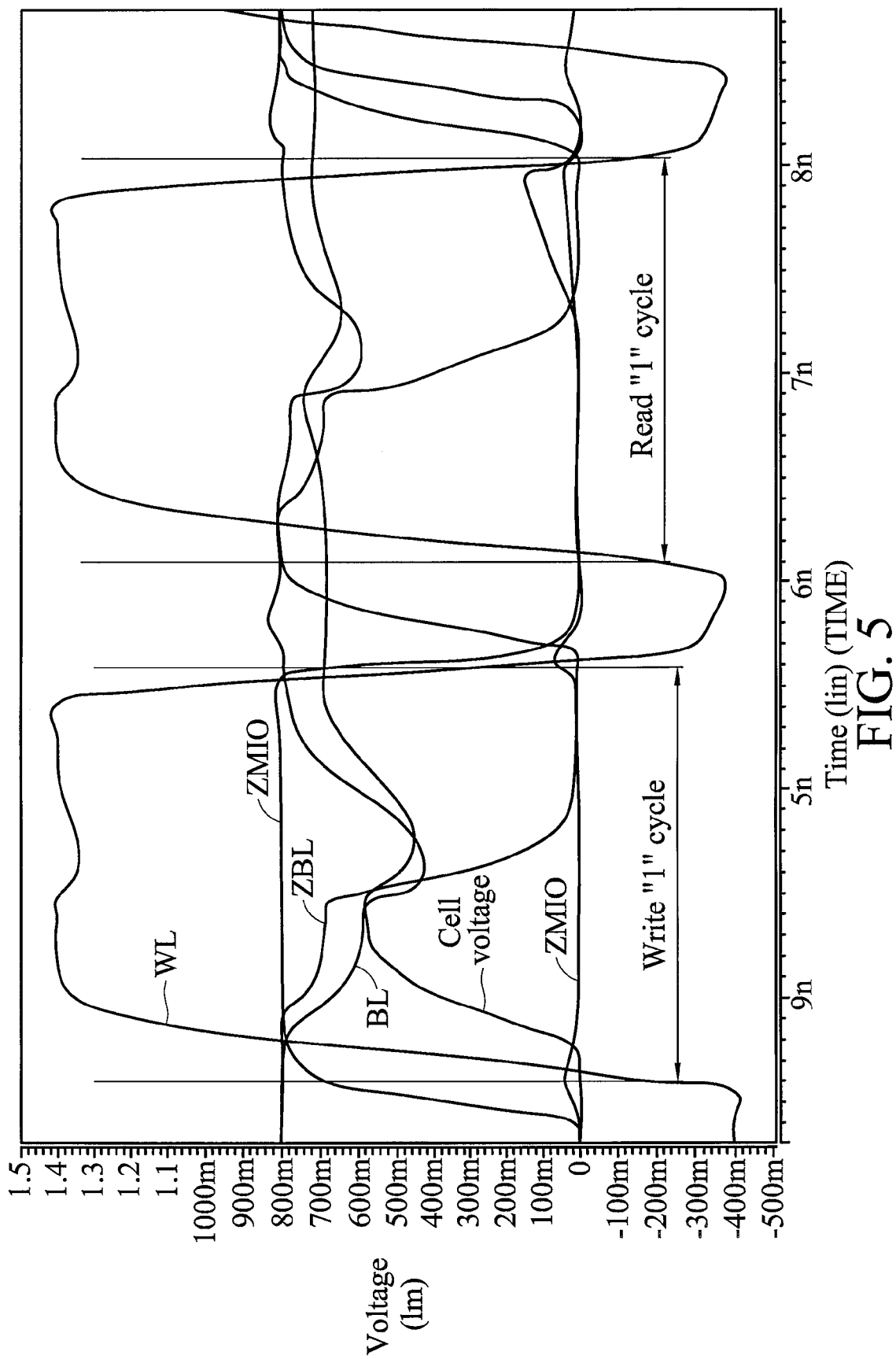
FIG. 5 is a timing diagram illustrating the write "1" and read "1" operations of the preferred embodiment circuit of FIG. 3.
Figure 6:
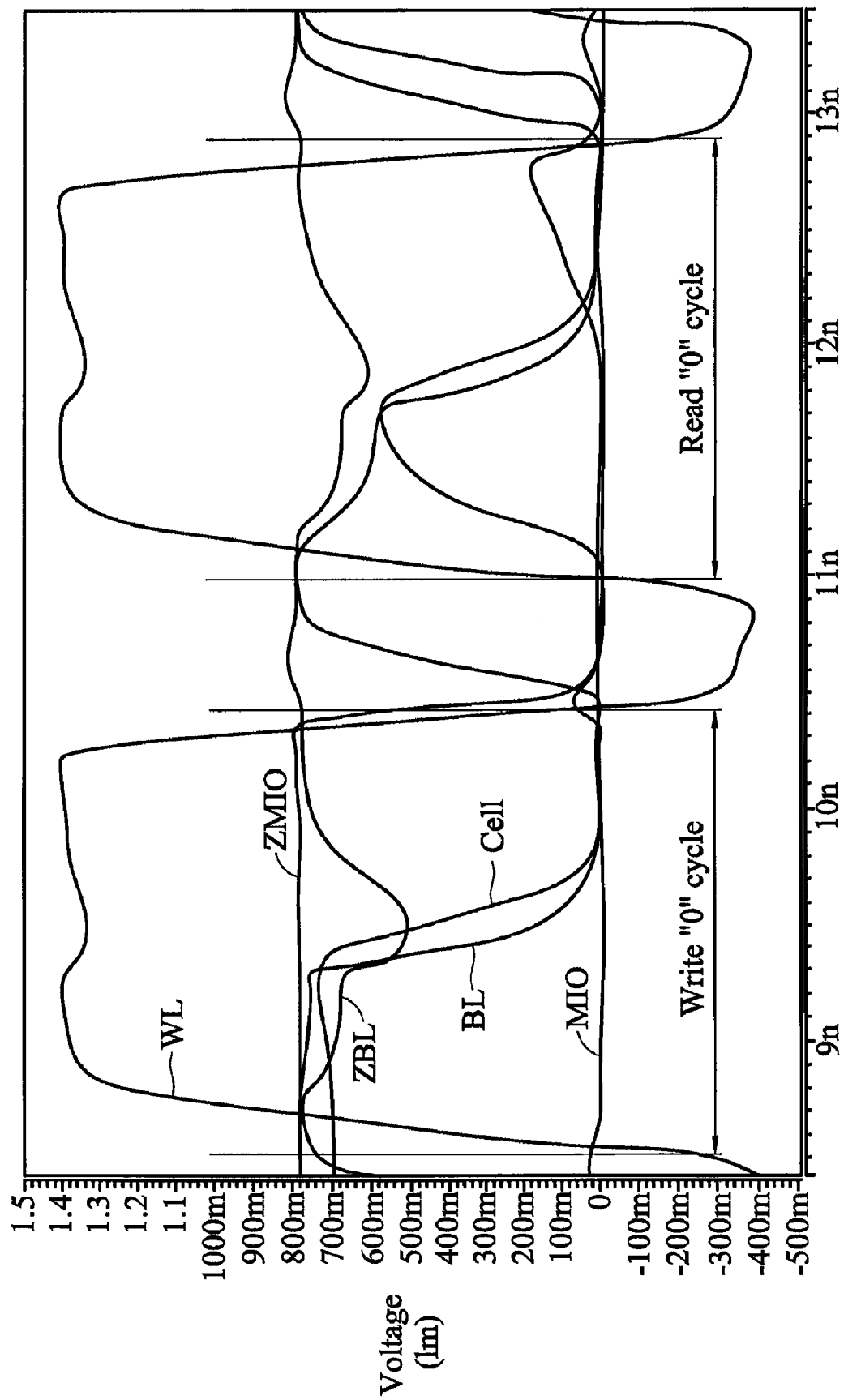
FIG. 6 is a timing diagram illustrating the write "0" and read "0" operations of the preferred embodiment circuit of FIG. 3.

Basic operations of the sense amplifier in FIG. 3 are depicted in FIGS. 5 and 6. Beginning with FIG. 5, there is illustrated for a first set of operating parameters, a Write "1" Read "1" operation, on a selected memory cell coupled to the local bit line BL. In FIG. 5, the global bit line MIO transitions to a high voltage, which in this exemplary embodiment is representative of a logical "1" data value. The local bit lines BL and ZBL are precharged and equalized to a potential Vdd, which for this set of parameters and process variations is 0.8 volts. Other voltage levels can be used for Vdd and these variations are contemplated as additional embodiments of the invention. The word line WL then transitions to a high potential, WL=1.4 volts in this example. In any event, WL is transitioned to a voltage that couples the memory cell MC to the local bit line BL. This higher potential may be referred to as Vpp. As the storage capacitor within the memory cell MC couples to the bit line BL through the access transistor in the memory cell, the charge sharing operation begins, and as can be seen in FIG. 5, the bitline BL and the bit line complement ZBL begin to separate in voltage. In this example, the non-selected line ZBL transitions to the Vref level, e.g., around 85% of Vdd, or 0.68 volts.

Following the charge sharing operation, the write data from the global bit lines is impressed on the local bit lines. As can be seen in the first half of FIG. 5, as the charge sharing occurs, BL begins developing a lower voltage than local bit line ZBL. Then, as the write data is impressed on the local bit lines, the "1" on the global bit line MIO causes the bit line ZBL to fall and through the sensing amplifier, BL will be forced to a "1" which will be stored in the memory cell. The sense amplifier will latch the local bit line data after the global bit line data forces the local bit lines to the data values for the write operation. Initially following the WL active transition, the bit line BL was less than the voltage on bit line ZBL, but as the sense amplifier becomes active, the higher voltage, or "1," corresponding to the write data replaces this lower voltage, and this "1" is written into the memory cell. Since the memory cell coupled to the non-selected bit line ZBL is not selected by its word line, the low voltage will not affect any stored data, but the sense amplifier does amplify the differential voltage between the nominal 0.85 Vdd potential on ZBL and the higher "1" on the bit line BL, thus the local bit lines are then separated to a full logical "1," a high Vdd level, and a full logical "0," or low voltage level. The word line WL then falls, ending the memory cycle, and the cell voltage can be seen as storing a "1," at voltage 0.679 volts in this example.

In FIG. 5, the timing diagram next illustrates a read "1" cycle. Again the local bit lines ZBL, BL are equalized or precharged to a level Vdd, and as the word line WL transitions to a high or active level, these lines begin at the same potential. During the charge sharing phase, when the access transistor of the selected memory cell now couples the capacitor (storing a "1") to the local bit line BL, the non-selected local bit line ZBL is transitioned to the Vref voltage. Thus when the sense amplifier becomes active, the difference between the stored "1" and the Vref voltage is the difference between Vdd and Vref, i.e., around 82 millivolts. The sense amplifier, sensing a higher voltage on the local bit line BL than the non-selected local bit line ZBL, then latches and amplifies the difference so that the local bit BL rises back to a full Vdd level while the complementary local bit ZBL falls to a "0," or low level.

The read path transistors then put the appropriate potential on the global bit lines MIO and ZMIO. Since the bit line ZBL is a low level, the PMOS transistor I44 in FIG. 3 becomes active and couples the global bit line MIO to a high potential Vdd, representing a "1" which can be seen at time 7.3n in FIG. 5 as a slight rise on the global bit line. (This slight rise is then sensed by a global bit line sense amplifier, not visible in FIG. 3, which is likewise a differential sense amplifier that latches the difference voltage and so transfers the "1" to a data I/O circuit to output the memory read data.) Meanwhile, the word line WL transitions back to a low or inactive level and the memory cell MC is restored so that the "1" remains stored in the memory cell as seen by the cell voltage Vcell at the end of the timing diagram of FIG. 5.

FIG. 6 similarly depicts a Write "0" Read "0" cycle of memory operations using the sense amplifier and bit lines in FIG. 3. Starting at the beginning of the timing diagram, the local bit lines BL, ZBL are again precharged and equalized to a Vdd level of 0.8 volts. As the data to be written is a "0," the global bit line GBL is maintained at a low level as the word line WL goes active to begin the memory cycle.

As the word line causes the selected memory cell to be coupled to the local bit line BL, the access transistor within the memory cell causes the capacitor to be coupled to the bit line BL. In this example the cell begins the cycle storing a "1" so initially bit line BL is maintained at a "1". The non-selected local bit line ZBL is coupled to the reference voltage Vref of 0.85×Vdd, or 0.68 Volts. In this example, the "1" on the global bit line ZMIO forces a "0" on line BL. Line ZBL is then forced to a "1" level. When the sense amplifier becomes active (the voltage at control line SN falls enabling the sense amplifier), the local bit line BL is coupled to a "0" and falls to a low voltage at time 9.4n, and the complementary bit line ZBL is then separated from it to a full Vdd potential, these differential values are then latched by the latching operation of the differential sense amplifier. At the end of the cycle the memory cell is coupled to a low voltage on the local bit line BL, and the capacitor within that cell is therefore fully discharged and when the word line WL transitions back to an inactive or low level, the cell is storing a "0".

The next operation illustrated in the timing diagram of FIG. 6 is a Read "0" cycle. Again the local bit lines BL and ZBL are precharged and equalized to a Vdd level by operation of the equalization circuit. As the word line WL transitions to a high level, the cell node is at a low voltage at time 11n. The coupling of the discharged memory cell capacitor to the bit line BL causes the bit line BL to fall to a voltage below the reference voltage Vref, while the non-selected bit line ZBL is coupled to the reference potential Vref. Thus the active bit line BL is at a voltage below the non-selected bit line ZBL Vref and the sense amplifier is presented with a differential voltage delta BL of 98 millivolts. At the end of the cycle, as shown in the timing diagram at time 12.8n, the global bit line MIO remains low (in contrast to the slight rise seen at the end of the cycle illustrated in FIG. 5, for the read "1" case). The global bit line MIO is low but the complementary global bit line ZMIO shows a slight rise. This differential voltage between global bit lines MIO and ZMIO is then sensed by another differential sense amplifier (not shown) and amplified for output by an I/O circuit to finish the read cycle. As the word line WL transitions back to a low, or inactive, level at time 13n in FIG. 6, the read cycle ends with the cell node voltage at a low level.

Figure 7:
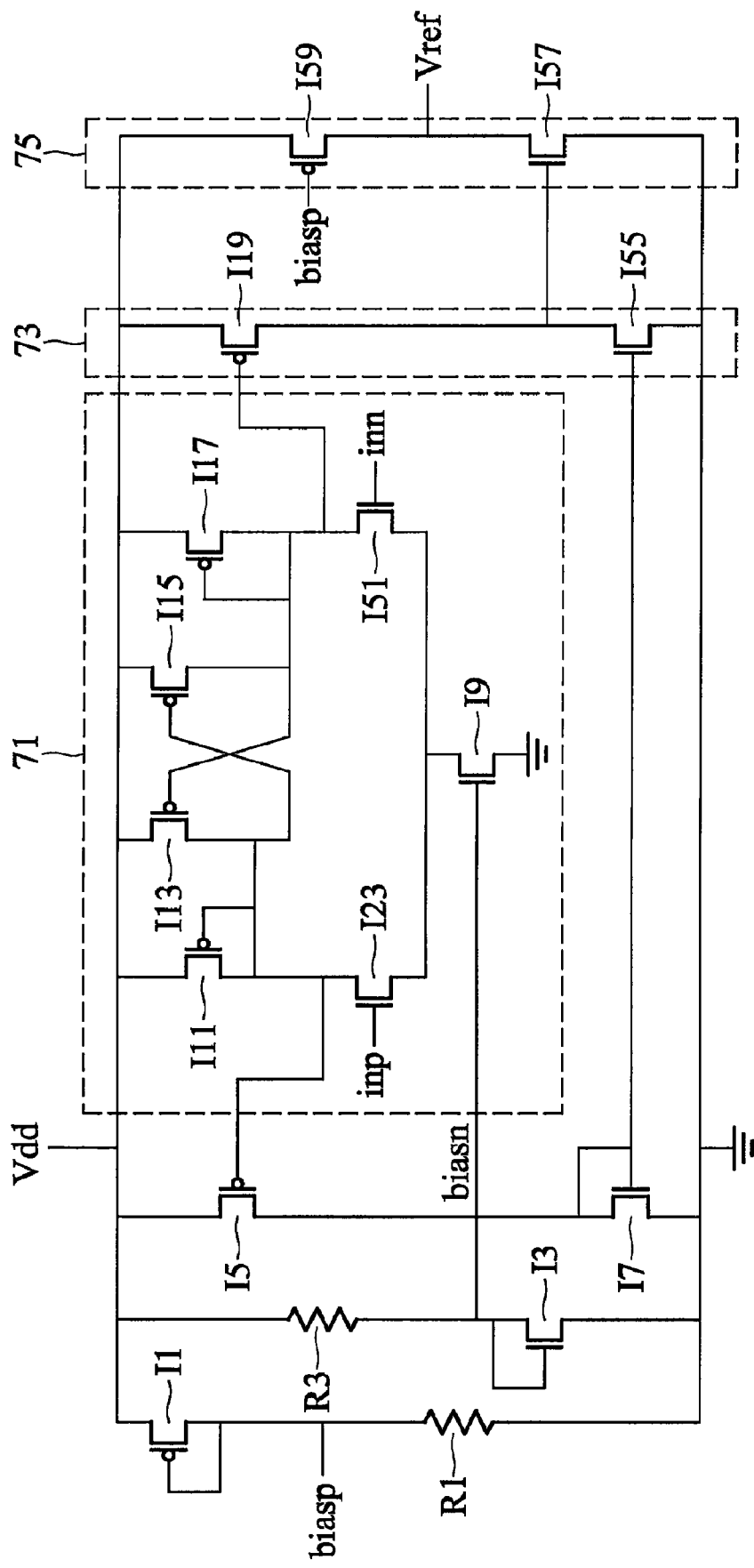
FIG. 7 is a simplified circuit diagram of a preferred embodiment voltage regulator circuit for use in conjunction with the sense amplifier circuit of FIG. 3.

FIG. 7 depicts in a simplified circuit schematic a preferred embodiment of a voltage regulator circuit for providing the reference voltage Vref, which is input to the sense amplifier of FIG. 3. A preferred voltage regulator circuit with three stages 71, 73 and 75 is illustrated. The first stage 71 is a differential amplifier with two inputs: inp, coupled to a reference voltage; and inn, a feedback voltage representative of the output voltage Vref. The differential amplifier is made up of transistors I5, I7, I9, I11, I13, I15, I17, I23, and I51. N-channel transistors I23, I51 receive the input bias voltage inp, provided by a trimmed voltage reference, for example, and the feedback input inn, which is a scaled voltage from the output Vref for the differential input. N-channel transistor I9 is biased by the voltage biasn. Reference biasn is provided by the voltage divider made up of resistor R3, which may be a polysilicon resistor provided on the chip, for example, and diode-connected transistor I3. Other known alternatives for providing the voltage biasn also may be used. Transistor I9 is a current source as it has a fixed bias at its gate terminal. P-channel transistors I13 and I15 are cross-coupled and coupled to the input of N-channel transistors I23, I51 by the pull-up P-channel transistors I11, I17. Transistors I5, I7 and I55 form a current mirror and P-channel transistor I19 then is coupled to the output of the differential amplifier.

The first stage 71 is a feedback amplifier that corrects the output voltage Vref by adding current when the feedback input voltage inn falls below the reference voltage inp, and by providing less current when the feedback input voltage inn rises above the comparator reference voltage inp, using negative feedback. This stage has a low gain, preferably 1-2, and a small output resistance (Rout) to reduce large voltage swing and to avoid a dominant pole in the transfer function.

Stage 73, the second stage of the preferred embodiment voltage regulator, provides a gain stage to drive the output circuit. The second stage is made up of transistors I19 and I55 which are chosen to provide driving capability to the output stage 75. Importantly, the second stage 73 in the preferred embodiment, is a common source circuit that has a high gain (preferably around 20, with a range of 10-30 as alternative preferred embodiments). The common source stage 73 provides high voltage swing to drive the final output stage. The transistors in this stage have a smaller channel length "L". Smaller transistor channel length moves the dominant pole to a much higher frequency and makes the circuit stable at the operating frequency.

Stage 75, the output stage, is comprised of an N-channel output driver transistor I57 and a P-channel transistor I59 coupled as a constant current source. N-channel output transistor I57 provides sufficient current to pull the non-selected bit line in a memory cycle down from the precharged voltage of Vdd to the lowered reference voltage Vref quickly. The P-channel transistor I59 is kept in saturation by the bias voltage biasp at the gate terminal. This bias voltage is set by the voltage divider circuit I1 and resistor R1, at the left side of FIG. 7. The small constant current of approximately 50 microamps supplied by P-channel MOS transistor I59 provides a small input voltage swing in the third stage 75.

In operation, the voltage regulator of FIG. 7 provides the voltage Vref with sufficient current sinking capability to rapidly pull down the non-selected local bit line from the precharged voltage Vdd provided by the equalization circuit, as shown in FIG. 3 above, to the lowered reference voltage Vref. This operation is performed at the beginning of each active memory cycle as shown in FIGS. 4, 5 and 6 above. The preferred embodiment voltage regulator circuit of FIG. 7 provides regulation with 20% load regulation when compared to a conventional push-pull regulator design as known in the prior art.

Figure 8:
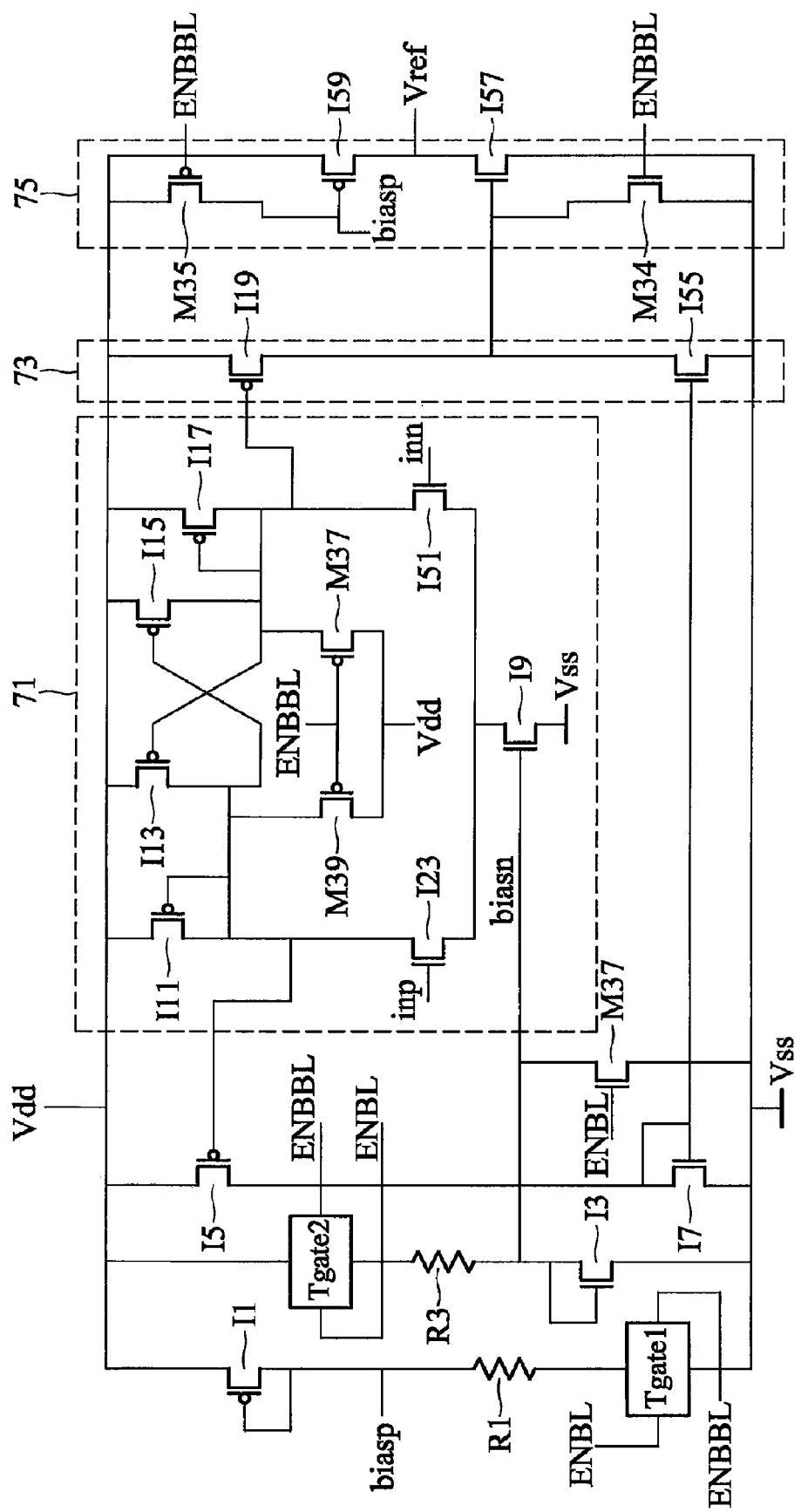
FIG. 8 is a more detailed circuit diagram of the circuit of FIG. 7.

FIG. 8 is a further detailed circuit schematic of the preferred regulator circuit in FIG. 7. In FIG. 8, the circuit schematic includes elements Tgate1 and Tgate2 which are preferably transmission gates or "T" gates coupled to enable inputs ENBL and ENBBL. P-channel transistors M37 and M39 which are also coupled to ENBL so that when ENBL is a low voltage, the cross-coupled latch circuit will be inactive as the PMOS transistors that form it will have Vdd at both gate and source. ENBL is also coupled P-channel transistor M35 which, when active, turns off the P-channel current source in the output stage, and ENBBL couples the output driver transistor to ground when the input ENBBL is high. The control inputs ENBBL (high when inactive) and ENBL (low when inactive, or high when active) therefore will shut down the regulator and prevent current from flowing in the differential amplifier, the output driver and the bias voltages biasn and biasp will be inactive.

When the voltage regulator is enabled, ENBL=0, ENBBL=1, transistor I59 is controlled by biasp, I57 is controlled by output voltage of stage 73. When the voltage regulator is disabled, ENBL=1 causes the circuit to shutoff I57, ENBBL=0 to shutoff I59. Since both P and N at output stage are now OFF in the regulator, Vref is then decided by other blocks not shown here. For example, in a burn-in mode, the regulator is disabled, and Vref is pulled to full "0" or full "1" for burn-in testing purposes.

Figure 9A:
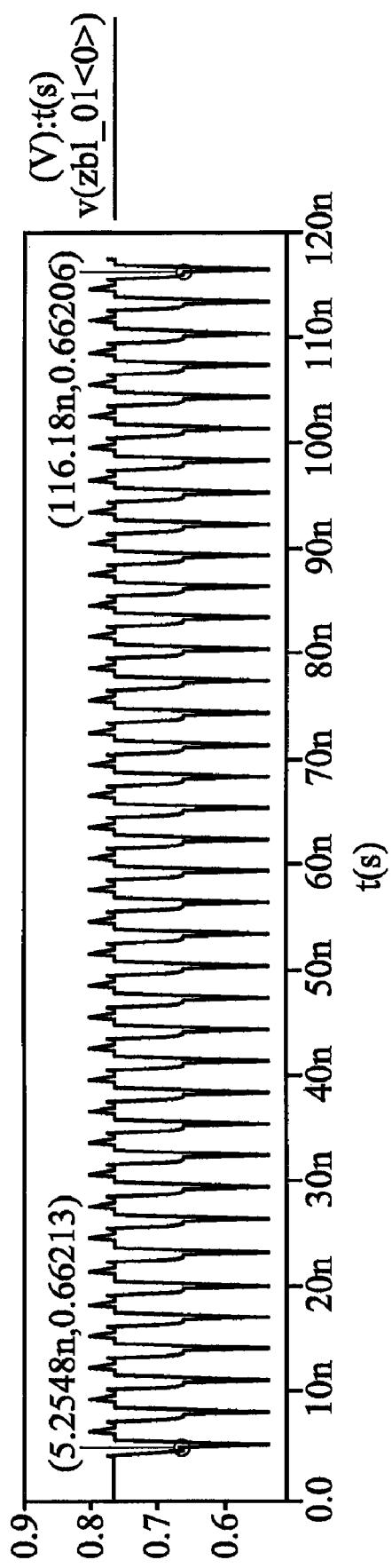
FIGS. 9*a*, 9*b*, and 9*c* are waveform diagrams illustrating the operation of the voltage regulator of FIG. 7 at different operating points.

FIG. 9 depicts for three different process corners in an exemplary semiconductor process model, the difference between the Vbl and the reference voltage Vref, with the regulator output coupled to the array. In FIG. 9a, which is modeling the P and N-channel devices as "slow slow" devices, the substrate temperature at −40 degrees Celsius, Vdd=0.765V, bit line voltage Vbl varies between 0.660 volts-0.661 volts, which is 86.5% of Vdd. Trimming bits can be used to adjust Vref final value to be exact 85% The voltage difference between Vref and BL (FIG. 3) is measured to be only 3 mV. Ideally we want the BL or ZBL value to be pulled to exact Vref level but I31 or I38 will have small voltage drop. The difference can be further minimized by upsizing I31 and I38 but large device means more power and area.

Figure 9B:
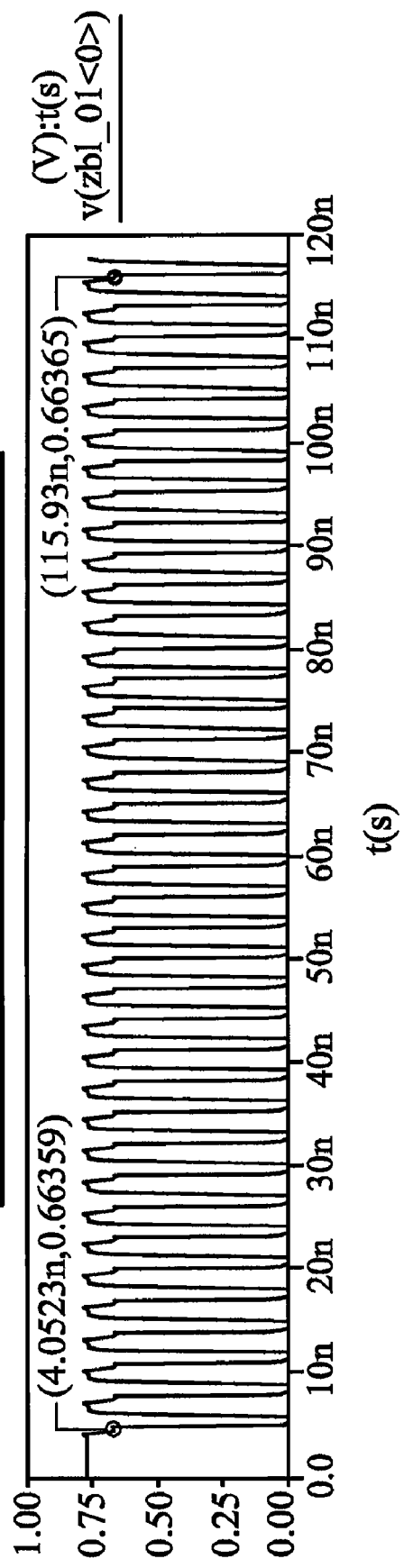
Figure 9C:
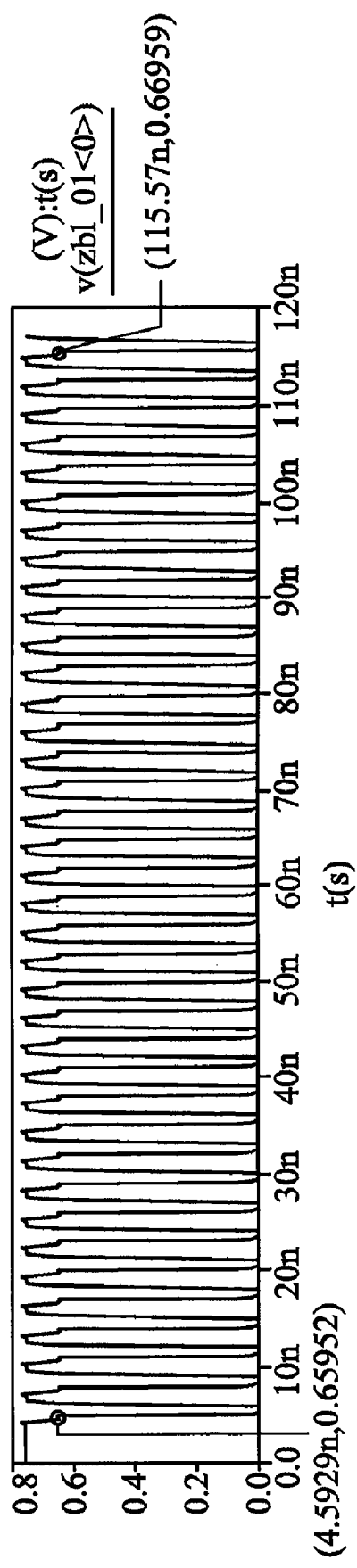

FIG. 9b is similar to FIG. 9a and shows the bit line voltage Vbl for the same parameters except with a temperature of 125 degrees Celsius, while FIG. 9c shows the same temperature but with the NMOS and PMOS transistors modeled as "fast fast" P-channel and N-channel devices. For the case illustrated in FIG. 9b, the difference Vbl-Vref is 3.5 millivolts, while for the example modeled in FIG. 9c the difference is 2 millivolts.

Figure 10:
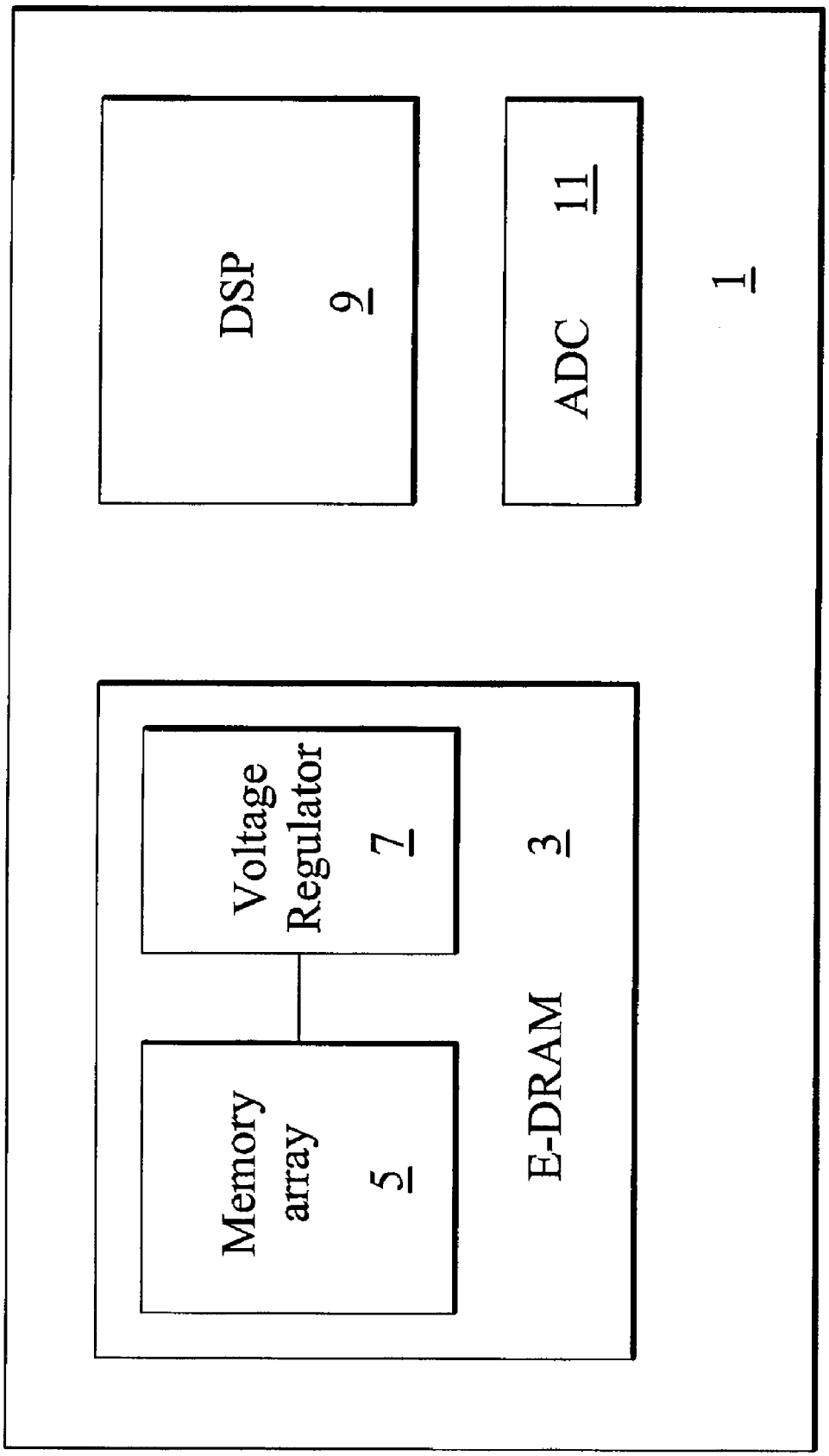
FIG. 10 depicts in a simplified block diagram a preferred embodiment integrated circuit including an embedded DRAM array and a voltage regulator.

FIG. 10 depicts, in a simplified block diagram form, an integrated circuit 1 that includes, among other circuits, an embedded DRAM array 3 including memory cells, bit line and sense amplifier circuitry 5 such as in the preferred embodiment of FIG. 3, and a preferred embodiment voltage regulator circuit 7, as illustrated in FIG. 7, coupled to the bit line and sense amplifier circuitry 5. Additional circuitry such as, for illustrative and non-limiting examples, DSP 9 and analog to digital converter (ADC) 11 may be included on integrated circuit 1, and DSP 9 may be programmed to implement any of a number of known, or desired, functions such as cell phones, PDAs, MP3 audio or video players, cameras, and the like. The embedded DRAM array (e-DRAM) 3 may be provided in a library of core functions that may be selected by a so-called "fabless" circuit designer, using known ASIC or semi-custom design tools to complete the design for an integrated circuit that can be manufactured by a semiconductor foundry. Such preferred embodiment devices, which may be referred to as SOCs or SOICs, may be designed and verified in their operation using automated simulation, layout and design tools and techniques as are well known to those skilled in the relevant arts.

The preferred embodiment bit line, sense amplifier circuitry, and the voltage regulator circuitry described above provides advantages when used in an e-DRAM array. The use of the preferred embodiments allows precise Vdd level sensing with fast bit line reference level charging using a voltage regulator with low load regulation. Load regulation is defined as the regulator voltage output variation divided by load current. A regulator with low load regulation is desired since the regulator output voltage is stable even with a large current load. The use of the global data bus (e.g. global bit lines MIO and ZMIO in FIG. 3) to control the read and write path transistors enables the use of an early write, with one write select being enough to control the whole sense bank, eliminating the routing and control transistors used in the prior art, thereby reducing the silicon area required. Because the global bit lines are only indirectly coupled to the local bit lines in the preferred embodiment circuits, the global bit line transition time need not be carefully controlled. The use of the full Vdd sensing and the 80% reference voltage Vref levels provides improved I/O path speeds over conventional DRAM sense amplifier and bit line coupling circuits.

The use of the preferred embodiments simplifies the timing control needed for an array of e-DRAM cells and maximizes the possible random access row cycle time for a given memory cycle. The preferred embodiment voltage regulator also provides 20% of load regulation when compared to the conventional push-pull voltage regulator designs used in conventional DRAM arrays.

Although the present invention and its advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the methods and steps described in the specification. As one of ordinary skill in the art will readily appreciate from the disclosure of the present invention, processes, or steps, presently existing or later to be developed that perform substantially the same function or achieve substantially the same result as the corresponding embodiments described herein may be utilized according to the present invention. Accordingly, the appended claims are intended to include within their scope such processes or steps.

What is claimed is:

1. A memory circuit comprising:
   at least one memory cell for storing a charge representative of a datum, the memory cell coupled to a word line signal and a local bit line signal and outputting a small voltage on the local bit line signal responsive to a voltage on the word line signal;
   a sense amplifier circuit coupled to the local bit line signal and another complementary bit line signal for receiving a small signal differential voltage between the local bit line signal and the complementary bit line signal and having a latch for receiving the small signal differential voltage, the sense amplifier circuit having outputs coupled to the local bit line signal and the complementary bit line signal, and the sense amplifier circuit receiving an enable control signal;
   an equalization circuit coupled to both the local bit line signal and the complementary bit line signal to provide a positive supply voltage responsive to an equalization signal; and
   a voltage regulator circuit selectively coupled to one of the local bit line signal and the complementary bit line signal responsive to a control signal and outputting a positive reference voltage on the selected one of the local bit line signal and the complementary bit line signal that is less than the positive supply voltage by a predetermined amount.

2. The memory circuit of claim 1, wherein the equalization circuit precharges the local bit line signal and the complementary bit line signal to a positive potential equal to the positive supply voltage in a precharge operation.

3. The memory circuit of claim 1, wherein the positive supply voltage is approximately equal to Vdd.

4. The memory circuit of claim 1, wherein the voltage regulator circuit further comprises a first stage differential amplifier having a first differential input coupled to an input reference potential and a second differential input coupled to a feedback voltage representative of an output voltage of the voltage regulator circuit, and operable to output a first output voltage to a second stage.

5. The memory circuit of claim 4, wherein the second stage comprises a common source amplifier coupled to the first output voltage and outputting an amplified voltage.

6. The memory circuit of claim 5, wherein the voltage regulator circuit further comprises a third stage with an input coupled to the amplified voltage, the third stage comprising a pull down circuit and a bias circuit, the pull down circuit outputting the positive reference voltage.

7. The memory circuit of claim 1, wherein the positive reference voltage is less than or equal to 85% of the positive supply voltage.

8. The memory circuit of claim 7, wherein the positive reference voltage is greater than or equal to 0.6 volts.

9. The memory circuit of claim 1, further comprising a read path circuit coupled to a global bit line signal and coupled to a complementary global bit line signal, the read path circuit outputting a voltage potential representative of a datum read from the memory cell responsive to a potential on the local bit line signal and the complementary bit line signal during a read cycle.

10. The memory circuit of claim 1, further comprising a write path circuit coupled to the local bit line signal and coupled to the complementary bit line signal, the write path circuit outputting a voltage potential representative of a datum to be written to the memory cell responsive to a potential on a global bit line and a complementary global bit line signal during a write cycle.

11. A method of sensing a charge stored in a capacitive storage memory cell, the method comprising:
   providing a bit line that is selectively coupled to a memory cell that is storing charge in a capacitor, responsive to a signal on a word line coupled to the memory cell;
   coupling a sense amplifier to the bit line for receiving a shared charge during a sense operation responsive to a sense amplifier enable signal;
   coupling the sense amplifier to a complementary bit line;
   coupling an equalization circuit to the bit line and to the complementary bit line, the equalization circuit placing a precharge positive supply voltage on the bit line and the complementary bit line, responsive to an equalization control signal;
   selectively coupling a voltage regulator to the complementary bit line responsive to a control signal, the voltage regulator outputting a positive reference voltage that is lower than the precharge positive supply voltage;
   coupling the memory cell to the bit line responsive to a positive voltage on the word line;
   receiving a differential voltage between the bit line and the complementary bit line into the sense amplifier during a sense operation responsive to the sense amplifier enable signal; and
   outputting a full logic level differential output voltage from the sense amplifier onto the bit line and the complementary bit line.

12. The method of claim 11, wherein outputting the positive reference voltage comprises:

receiving an input reference potential into a first stage circuit in the voltage regulator, the first stage circuit being a differential amplifier having a second input coupled to a feedback from an output of the voltage regulator, and outputting a voltage;

coupling the output voltage from the first stage circuit to a second stage common source amplifier and outputting an amplified voltage; and coupling the amplified voltage to a third stage output buffer that outputs the positive reference voltage.

13. The method of claim 12, wherein coupling the amplified voltage to the third stage output buffer comprises coupling the amplified voltage to an NMOS driver coupled between the positive reference voltage output and a ground supply voltage, and coupling the NMOS driver to a PMOS bias circuit coupled to a positive supply voltage as a current source.

14. The method of claim 12, wherein the positive reference voltage is less than or equal to 85% of a positive supply voltage.

15. The method of claim 12, wherein the positive reference voltage is less than or equal to 85% Vdd.

16. The method of claim 11, further comprising:
coupling the bit line and the complementary bit line to a read data circuit, the read data circuit providing a voltage potential to one of a pair of complementary global bit lines responsive to the full logic level differential output voltage on the bit line and the complementary bit line.

17. The method of claim 11, further comprising:
coupling the bit line and the complementary bit line to a write data circuit, the write data circuit providing the voltage potential to one of the bit line and the complementary bit line responsive to a voltage on the pair of complementary global bit lines during the sense operation, to write data to the memory cell.

18. An integrated circuit including an embedded memory circuit, the integrated circuit comprising:
digital logic circuitry providing a user specified function responsive to receiving input signals, and generating output signals; and
a memory circuit coupled to the digital logic circuitry, the memory circuit comprising:
a plurality of capacitive storage memory cells, each cell coupled to a word line arranged in one of a plurality of rows within the memory circuit, and each cell coupled to a local bit line selected from one of pairs of complementary bit lines arranged in columns within the memory circuit;
a sense amplifier circuit coupled to at least one pair of the complementary bit lines, the sense amplifier circuit comprising a differential input circuit for receiving a small signal differential voltage and further operable to output an amplified differential voltage signal to the respective complementary bit line, responsive to a sense amplifier enable signal;
an equalization circuit coupled to the at least one pair of the complementary bit lines for outputting a positive supply voltage precharge onto the at least one pair of complementary bit lines, responsive to an equalization input signal; and
a voltage regulator circuit outputting a positive reference voltage that is lower than the positive supply voltage by a predetermined amount, the voltage regulator circuit outputting the positive reference voltage to a selected one of the one pairs of complementary bit lines during sensing by the sense amplifier circuit.

19. The integrated circuit of claim 18, wherein the voltage regulator circuit comprises a three stage amplifier circuit receiving an input reference potential into an input of a first stage, the first stage comprising a differential amplifier having a second input coupled to a feedback signal from the output of the voltage regulator circuit and outputting a first voltage.

20. The integrated circuit of claim 19, wherein the voltage regulator circuit further comprises a second stage of the three stage amplifier circuit, the second stage comprising a common source amplifier receiving the first voltage and outputting an amplified voltage.

21. The integrated circuit of claim 20, wherein the voltage regulator circuit further comprises a third stage of the three stage amplifier circuit, the third stage comprising an output driver buffer circuit receiving the amplified voltage and outputting the positive reference voltage.

22. A voltage regulator circuit for outputting a positive reference voltage less than a positive supply voltage to a selected bit line in a memory integrated circuit, the voltage regulator circuit comprising:
a three stage amplifier circuit comprising:
the first stage comprising a differential pair voltage amplifier having a first input coupled to a reference potential and a second input coupled to a feedback from the output of the voltage regulator circuit, outputting a first output voltage;
a second stage comprising a common source amplifier coupled to receive the first output voltage and outputting an amplified voltage; and
a third stage comprising an output driver circuit coupled to receive the amplified voltage and outputting the positive reference voltage to the selected bit line of a pair of bit lines, the positive reference voltage being less than or equal to 85% of the positive supply voltage.

23. The voltage regulator circuit of claim 22, wherein the first stage has a gain of less than about 3.

24. The voltage regulator circuit of claim 22, wherein the second stage has a gain of greater than about 10.

25. The voltage regulator circuit of claim 22, wherein the output driver circuit comprises an NMOS driver coupled between the positive reference voltage and a ground supply and a PMOS transistor coupled as a bias circuit for the NMOS driver.

26. The voltage regulator circuit of claim 22, wherein the positive supply voltage is less than or equal to about 1.0 volts, and the positive reference voltage is less than or equal to about 0.85 volts.

27. An integrated circuit, comprising:
digital logic circuitry; and
embedded memory circuitry, the embedded memory circuitry comprising:
a plurality of word lines arranged in rows;
a plurality of pairs of complementary bit lines arranged in columns intersecting the word lines and coupled to sense amplifiers;
a plurality of memory cells each storing charge in a capacitor, the memory cells disposed at the intersections of the rows of the word lines and the columns of complementary bit lines and outputting a voltage on a respective one of the bit lines of one of the pairs of the complementary bit lines responsive to a potential on a respective word line;
a plurality of equalization circuits coupled to the pairs of complementary bit lines and operable to couple a precharge positive voltage on each of the bit lines in a respective complementary pair of bit lines responsive to a control signal; and a plurality of voltage regulator circuits selectively coupled to the pairs of complementary bit lines and operable to couple a positive reference voltage less than the precharge positive voltage on one of the bit lines of the pair of complementary bit lines, responsive to a second control signal, the positive reference voltage being less than or equal to 85% of the precharge positive voltage.

28. The integrated circuit of claim 27, wherein the digital logic circuitry is programmable.

29. The integrated circuit of claim 28, wherein the digital logic circuitry is a digital signal processor.

* * * * *